US012802950B2

(12) United States Patent
Kim et al.

(10) Patent No.: US 12,802,950 B2
(45) Date of Patent: Nov. 17, 2026

(54) SCRUBBER AND TREATMENT METHOD OF SEMICONDUCTOR PROCESS GAS USING THE SAME

(71) Applicant: SAMSUNG ELECTRONICS CO., LTD., Suwon-si (KR)

(72) Inventors: Hyun Seok Kim, Suwon-si (KR); Mukyeong Kim, Suwon-si (KR); Sejin Park, Suwon-si (KR); Iljeong Heo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/816,957

(22) Filed: Aug. 27, 2024

(65) Prior Publication Data

US 2025/0132137 A1 Apr. 24, 2025

(30) Foreign Application Priority Data

Oct. 24, 2023 (KR) ........................ 10-2023-0143065
Apr. 9, 2024 (KR) ........................ 10-2024-0047923

(51) Int. Cl.
*H01J 37/32* (2006.01)
*C25B 1/04* (2021.01)
*C25B 15/08* (2006.01)

(52) U.S. Cl.
CPC .......... *H01J 37/32844* (2013.01); *C25B 1/04* (2013.01); *C25B 15/081* (2021.01); *H01J 37/32871* (2013.01)

(58) Field of Classification Search
CPC .......... H01J 37/32844; H01J 37/32871; C25B 15/081; C25B 1/04
See application file for complete search history.

(56) References Cited

U.S. PATENT DOCUMENTS

| | | | |
|---|---|---|---|
| 7,758,818 | B2 | 7/2010 | Lee et al. |
| 8,574,504 | B2 | 11/2013 | Kim et al. |
| 9,377,194 | B2 | 6/2016 | Kim |
| 11,413,577 | B2 | 8/2022 | Hong |
| 2003/0164309 | A1 | 9/2003 | Nakamura et al. |

FOREIGN PATENT DOCUMENTS

| | | | | |
|---|---|---|---|---|
| KR | 0328632 | | 3/2002 | |
| KR | 0623368 | | 9/2006 | |
| KR | 0623665 | B1 | 9/2006 | |
| KR | 0910875 | | 8/2009 | |
| KR | 0919619 | | 9/2009 | |
| KR | 1934561 | B1 | 3/2019 | |
| KR | 2072643 | | 2/2020 | |
| KR | 2432367 | | 8/2022 | |
| WO | WO-2009010792 | A2 * | 1/2009 | ........ H01J 37/32844 |

* cited by examiner

*Primary Examiner* — Henry Luong
(74) *Attorney, Agent, or Firm* — Fish & Richardson P.C.

(57) ABSTRACT

A scrubber includes a plasma treatment system, a hydrogen supply system, and a wet treatment system. The plasma treatment system performs a plasma treatment in which a process gas and a hydrogen gas are reacted using plasma. The hydrogen supply system supplies the hydrogen gas to the plasma treatment system. The wet treatment system performs a wet treatment in which a by-product generated by the plasma treatment is wet-treated.

18 Claims, 9 Drawing Sheets

SCRUBBER AND TREATMENT METHOD OF SEMICONDUCTOR PROCESS GAS USING THE SAME

CROSS-REFERENCE TO RELATED APPLICATION

This application claims priority to Korean Patent Application No. 10-2023-0143065 filed on Oct. 24, 2023, and Korean Patent Application No. 10-2024-0047923 filed on Apr. 9, 2024, in the Korean Intellectual Property Office, the entire contents of which are incorporated herein by reference.

BACKGROUND

Semiconductor devices may have a small size factor and may be configured to perform various functions and thus are widely used in various electronic industries. Various semiconductor process gases may be released or emitted during a manufacturing process of semiconductor devices. If the semiconductor process gas is released to an outside without a separate purification process, problems such as environmental pollution, equipment damage, a safety accident, or so on may occur. Accordingly, the semiconductor process gas is decomposed or purified using a scrubber in a safe state and the decomposed or purified gas is released.

In a scrubber, a burner is used to combust the semiconductor process gas and thermally decompose the semiconductor process gas. Since fuel and a combustion gas (e.g., a gas including oxygen, as an example, an air) are supplied for the combustion of the semiconductor process gas, an exhaust gas includes a lot of harmful materials such as carbon dioxide and nitrogen oxide. Accordingly, an amount of the exhaust gas is large and an exhaust load may be large. Further, an equipment may be complicated because the scrubber includes the burner for the combustion, a supply line for supplying the combustion gas, or so on.

SUMMARY

In general, in some aspects, the present disclosure is directed toward a scrubber capable of having a simple structure and reducing harmful materials and an exhaust load, and a treatment method of a semiconductor process gas using the same.

According to some implementations, the present disclosure is directed to a scrubber that includes a plasma treatment system, a hydrogen supply system, and a wet treatment system. The plasma treatment system performs a plasma treatment in which a process gas and a hydrogen gas are reacted using plasma. The hydrogen supply system supplies the hydrogen gas to the plasma treatment system. The wet treatment system performs a wet treatment in which a by-product generated by the plasma treatment is wet-treated.

According to some implementations, the present disclosure is directed to a scrubber that includes a plasma treatment system and a hydrogen supply system. The plasma treatment system decomposes a process gas including a fluorine-including gas using plasma. The hydrogen supply system supplies a hydrogen gas to the plasma treatment system.

According to some implementations, the present disclosure is directed to a treatment method of a semiconductor process gas that includes generating a hydrogen gas, performing a plasma treatment in which a process gas and the hydrogen gas are reacted using plasma, and performing a wet treatment in which a by-product generated by the plasma treatment is wet-treated.

According to some implementations, the present disclosure is directed to a hydrogen supply system that supplies a hydrogen gas to a plasma treatment system, efficiency of a plasma treatment that decomposes a process gas may be enhanced by using plasma and the hydrogen gas, and an amount of harmful materials included in an exhaust gas may be reduced and an exhaust load may be reduced. The hydrogen supply system may include an electrolysis unit that may have a small size and be operated by a small amount of water and a small amount of power, and thus, a scrubber may have a simple structure or equipment.

BRIEF DESCRIPTION OF THE DRAWINGS

Example implementations will be more clearly understood from the following detailed description, taken in conjunction with the accompanying drawings.

DETAILED DESCRIPTION

Figure 1:
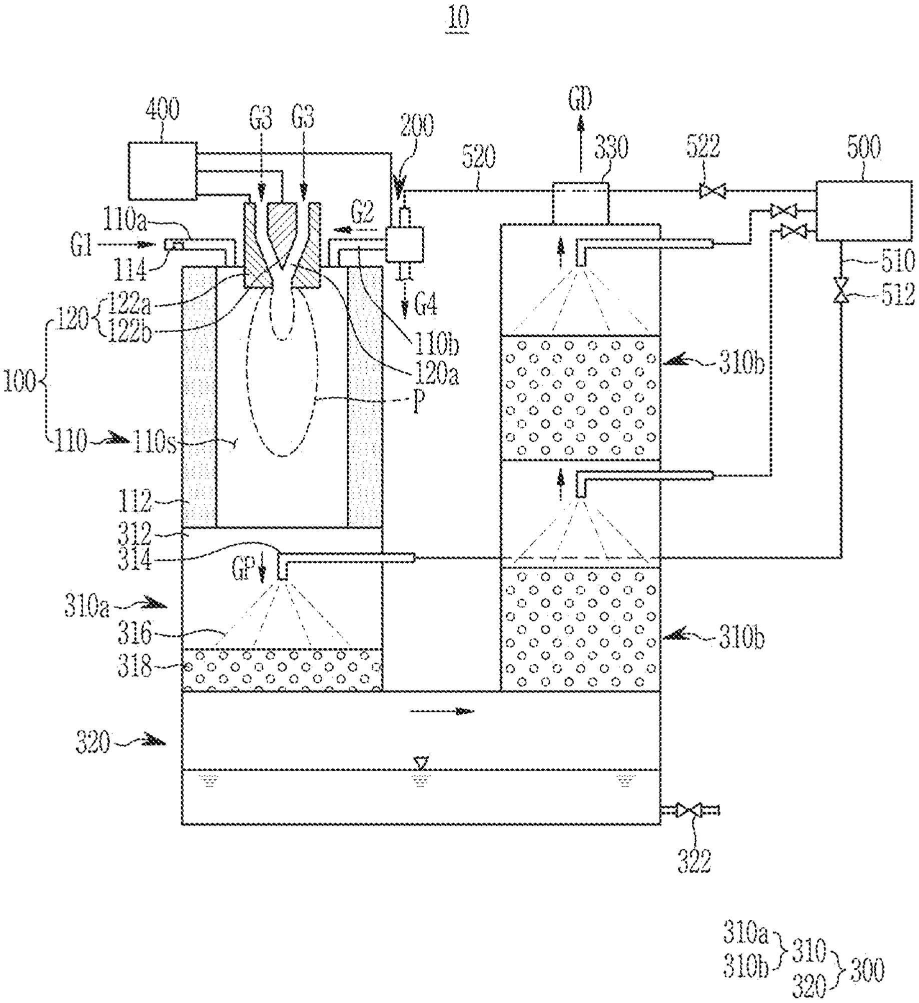
FIG. 1 schematically illustrates an example of a scrubber according to some implementations.

Hereinafter, example implementations will be explained in detail with reference to the accompanying drawings. The present disclosure may be implemented in various different forms and is not limited to the embodiments provided herein.

In the present disclosure, portions unrelated to the description may be omitted in order to clearly describe the present disclosure, and the same or similar components may be denoted by the same reference numeral throughout the present specification. Further, since a size and/or a thickness of a portion, a region, a member, a unit, a layer, a film, a substrate, or so on illustrated in the accompanying drawings may be illustrated for better understanding and convenience of explanation, the present disclosure is not limited to the illustrated size and/or thickness. In the drawings, thicknesses of portions, regions, members, units, layers, films, etc., may be enlarged or exaggerated for convenience of explanation and/or simple illustration.

It will be understood that when a component such as a portion, a region, a member, a unit, a layer, a film, a substrate, or so on is referred to as being "on" another component, it may be directly on another component or an intervening component may also be present. In contrast, when a component is referred to as being "directly on" another component, there is no intervening component present. Further, when a component is referred to as being "on" or "above" a reference component, a component may be positioned on or below the reference component, and does not necessarily be "on" or "above" the reference component toward an opposite direction of gravity.

In addition, throughout the specification, unless explicitly described to the contrary, the word "comprise", "include", or "contain", and variations such as "comprises", "comprising", "includes", "including", "contains" or "containing" will be understood to imply the inclusion of other components rather than the exclusion of any other components. Further, throughout the specification, a phrase "on a plane", "in a plane", "on a plan view", or "in a plan view" may indicate a case where a portion is viewed from above or a top portion, and a phrase "on a cross-section" or "in a cross-sectional view" may indicate a vertical cross-sectional viewed from a side.

Hereinafter, with reference to FIGS. 1 and 2, examples of a scrubber and a treatment method of a semiconductor process gas using the same will be described in detail.

Figure 2:
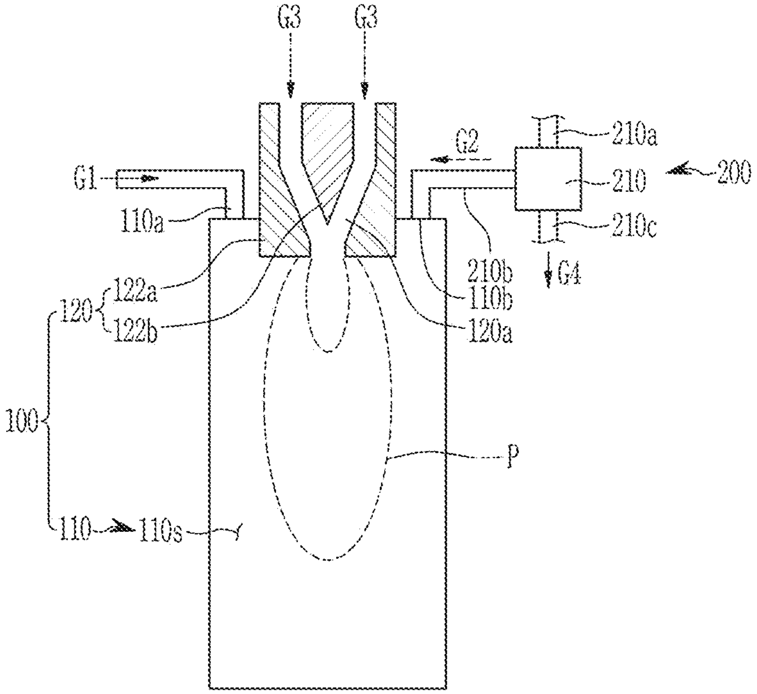
FIG. 2 schematically illustrates an examples of a plasma treatment portion and a hydrogen supply portion that are included in the scrubber illustrated in FIG. 1 according to some implementations.

FIG. 1 schematically illustrates an example of a scrubber, and FIG. 2 schematically illustrates an examples of a plasma treatment portion and a hydrogen supply portion that are included in the scrubber 10 illustrated in FIG. 1 according to some implementations. In FIG. 2, a body 110 and a plasma generator 120 of the plasma treatment portion 100 are mainly illustrated, and a thermal insulation member 112 and a sensor 114 are omitted.

In FIGS. 1 and 2, a scrubber 10 may include a plasma treatment system 100, a hydrogen supply system 200, and a wet treatment system 300. The plasma treatment system 100 may perform a plasma treatment in which a process gas G1 and a hydrogen gas G2 (e.g., $H_2$) are reacted using plasma P. The hydrogen supply system 200 may supply the hydrogen gas G2 to the plasma treatment portion 100. The wet treatment system 300 may perform a wet treatment in which a by-product generated by the plasma treatment is wet-treated. The scrubber 10 may further include a power supply system 400 and a water supply system 500.

The scrubber 10 may be a point of use (POU) scrubber disposed separately from a semiconductor manufacturing process line. The semiconductor manufacturing process line may refer to a manufacturing process line configured to manufacture a semiconductor device, a semiconductor chip, a semiconductor package, or so on. For example, the scrubber 10 may be disposed in a facility sub fab (FSF). The scrubber 10 may decompose the process gas G1 using the plasma treatment, and may be referred to as a POU plasma scrubber. However, the present disclosure is not limited to a position of the scrubber 10. In some implementations, the scrubber 10 may be disposed at a front side of a vacuum pump that is included in the semiconductor manufacturing process line, or be disposed in a portion other than the facility sub fab.

The plasma treatment system 100 may perform the plasma treatment (e.g., an atmospheric plasma treatment) in which the process gas G1 and the hydrogen gas G2 are reacted by using the plasma P to decompose (e.g., thermally decompose and/or radically decompose) the process gas G1.

The process gas G1 may be or include any of various gases, such as a raw process gas of a semiconductor manufacturing process, a gas that is generated in the semiconductor manufacturing process, or so on. The process gas G1 may be referred to as a semiconductor process gas, a raw gas, or so on.

In some implementations, the process gas G1 may include a fluorine-including gas that includes fluorine. For example, the process gas G1 may include a perfluorinated compound (PFC), such as, $NF_3$, $CF_4$, $CHF_3$, $SF_6$, $C_2F_6$, or so on. The process gas G1 may include a nitrogen gas (e.g., $N_2$) as a bulk gas. That is, in some implementations, the process gas G1 may be an oxygen-free gas that includes the fluorine-including gas and the bulk gas. In some implementations, in the process gas G1, an amount of the fluorine-including gas or the perfluorinated compound may be less than an amount of the bulk gas. For example, the fluorine-including gas or the perfluorinated compound may be included by 1 vol % or less based on a total 100 vol % of the process gas G1. However, the present disclosure is not limited thereto. In some implementations, the fluorine-including gas or the perfluorinated compound may be included more than 1 vol % based on the total 100 vol % of the process gas G1.

In some implementations, the hydrogen gas G2 may be supplied to the plasma treatment system 100 by the hydrogen supply system 200. The hydrogen supply system 200 will be described later in more detail.

The plasma treatment system 100 may include a body 110 and a plasma generator 120.

The body 110 may have an internal space 110*s* in which the plasma treatment is performed. The body 110 may be a chamber, a housing, a pipe, a discharge tube, or so on that has the internal space 110*s*. For example, the body 110 may be a cylindrical pipe. However, the present disclosure is not limited to a shape, a type, a kind, or so on of the body 110. In FIG. 1, it is illustrated as an example that an area (e.g. a planar area) of the body 110 is greater than an area (e.g. a planar area) of the plasma generator 120, but the present disclosure is not limited thereto. An area of the body 110 may be the same as or less than an area of the plasma generator 120. In some implementations, the area of the body 110 is less than the area of the plasma generator 120, which will be described later with reference to FIG. 6.

The body 110 may be an adiabatic reactor in which a heat exchange with an outside is prevented or suppressed. In FIG. 1, it is illustrated as an example that a thermal insulation member 112 for a thermal insulation of the body 110 is disposed outside the body 110, but the present disclosure is not limited thereto.

The body 110 may include or be formed of a corrosion-resistant material to prevent corrosion due to a by-product (e.g., a hydrogen fluoride (HF) gas) that is generated by the plasma treatment. For example, the body 110 may include or be formed of stainless steel, a corrosion-resistant nickel alloy, or so on. The corrosion-resistant nickel alloy may an alloy that includes nickel and further includes at least one of molybdenum, manganese, tungsten, chromium, silicon, aluminum, iron, or titanium. However, the present disclosure is not limited thereto, and the body 110 may include any of various materials. In some implementations, at least a partial portion of the body 110 may include an insulating material.

The plasma generator 120 may generate plasma P using electrical energy in the internal space 110*s* of the body 110. Since the plasma P used in the plasma treatment is generated using the electrical energy, it is safe and does not use fuel for combustion, thereby reducing a direct emission or a direct discharge of harmful materials (e.g., air pollutants or greenhouse gases). More particularly, when the electric energy is renewable energy, the harmful materials (e.g., the air pollutants or the greenhouse gases) may be effectively reduced.

The plasma P that is generated by the plasma generator 120 may be or include arc plasma, gliding arc plasma, plasma generated by dielectric barrier discharge, plasma generated by corona discharge (e.g., pulse corona discharge), microwave plasma, capacitively coupled plasma (CCP), inductively coupled plasma (ICP), or so on. The plasma P that is generated by the plasma generator 120 may be or include direct current (DC) plasma, alternating current (AC) plasma, radio frequency (RF) plasma, or so on. However, the present disclosure is not limited thereto. A structure of the plasma generator 120, a principle of generating the plasma P in the plasma generator 120, power used in the plasma generator 120, a type of plasma P generated by the plasma generator 120, or so on may be variously modified.

In FIG. 1 and FIG. 2, the plasma generator 120 may include a plasma torch that generates a thermal plasma jet, and the plasma P that is generated by the plasma generator 120 may be arc plasma. The plasma generator 120 may include a first electrode 122*a* and a second electrode 122*b* that are mounted to be spaced apart from each other to form a gas flow passage 120*a*. An electrode assembly that includes the first electrode 122*a* and the second electrode 122*b* may have a cylindrical shape or a ring shape. The first electrode 122*a* or the second electrode 122*b* may include or be formed of any of various materials (e.g., a metal material or so on). Any of various powers, such as, DC power, AC power, or so on, may be applied to the first electrode 122*a* or the second electrode 122*b* to generate the plasma P.

The gas flow passage 120*a* that is disposed between the first electrode 122*a* and the second electrode 122*b* may include an inlet that is connected to an outside and an outlet that is connected to the internal space 110*s* of the body 110. The outlet of the gas flow passage 120*a* may correspond to an inlet of the body 110 through which a gas (e.g. a discharge gas G3) supplied to generate the plasma P inflows.

In some implementations, the plasma treatment system 100 may include a process gas inlet 110*a* through which the process gas G1 inflows and a hydrogen gas inlet 110*b* through which the hydrogen gas G2 inflows. The process gas inlet 110*a* and the hydrogen gas inlet 110*b* may be connected to the body 110 and may be connected (e.g., directly connected) or communicated to the internal space 110*s* of the body 110. The process gas inlet 110*a* may be connected to a first position of the body 110, and the hydrogen gas inlet 110*b* may be connected to a second position of the body 110 that is different from the first position of the body 110. That is, the process gas inlet 110*a* and the hydrogen gas inlet 110*b* may be connected to different portions of the body 110.

In some implementations, the process gas G1 may be provided to the internal space 110*s* of the body 110 through the process gas inlet 110*a*, and the hydrogen gas G2 may be provided to the internal space 110*s* of the body 110 through the hydrogen gas inlet 110*b*. A discharge gas G3 configured to generate the plasma P may be supplied to the internal space 110*s* of the body 110 through the gas flow passage 120*a* of the plasma generator 120. The discharge gas G3 may be a gas configured to generate the plasma P, and may be referred to as a plasma generation gas, a bulk gas, or so on. For example, the discharge gas G3 may include or be formed of an argon gas, a nitrogen gas, or so on. However, the present disclosure is not limited to a material of the discharge gas G3, and the discharge gas G3 may include or be formed of any of various oxygen-free gases that does not include oxygen.

The process gas G1 and/or the hydrogen gas G2 may be supplied at a portion behind a position where the plasma P generates so that the process gas G1 and/or the hydrogen gas G2 passes through the plasma P generated by the discharge gas G3. For example, when the body 110 is disposed at a lower portion of the plasma generator 120, the process gas G1 and/or the hydrogen gas G2 may be supplied to an upper portion of the outlet of the plasma generator 120. When the body 110 is disposed at the lower portion of the plasma generator 120, the process gas inlet 110*a* and/or the hydrogen gas inlet 110*b* may be disposed at the upper portion of the outlet of the plasma generator 120. However, the present disclosure is not limited thereto. If the reaction between the process gas G1 and the hydrogen gas G2 using the plasma P is possible, positions of the process gas inlet 110*a* and/or the hydrogen gas inlet 110*b* may be variously modified.

In some implementations, paths of the process gas G1, the hydrogen gas G2, and the discharge gas G3 that are supplied to the internal space 110*s* of the body 110 may be separated from each other. Accordingly, supplies of the process gas G1, the hydrogen gas G2, and the discharge gas G3 may be easily and stably controlled. In this instance, an indirect plasma treatment may be performed to the process gas G1. In the indirect plasma treatment, the process gas G1 may be separately supplied from the discharge gas G3 and pass through the plasma P generated by the discharge gas G3. Thereby, stability may be enhanced. However, the present disclosure is not limited thereto, and a structure or a method of supplying the process gas G1, the hydrogen gas G2, and/or the discharge gas G3 to the internal space 110*s* of the body 110 may be variously modified. Some implementations will be described later in detail with reference to FIG. 4 to FIG. 6.

In FIG. 1 and FIG. 2, it is illustrated as an example that the body 110 may be disposed at a lower portion of the plasma generator 120 and the body 110 may have a shape that extends in a vertical direction, but the present disclosure is not limited thereto. The body 110 may be disposed at one side of the plasma generator 120 in a horizontal direction and the body 110 may extend in the horizontal direction. Positions, arrangements, shapes, or so on of the body 110 and the plasma generator 120 may be variously modified.

The plasma treatment system 100 may include a cooling line for cooling the body 110 and/or the plasma generator 120. For example, the plasma treatment system 100 may include a cooling line for cooling the plasma generator 120. Any of various cooling media (e.g., cooling water) may be circulated in the cooling line to cool the plasma generator 120. However, the present disclosure is not limited thereto. A position, a shape, or a cooling method, or so on of the cooling line may be variously modified.

The plasma treatment system 100 may perform the plasma treatment in which the process gas G1 and the hydrogen gas G2 are reacted using the plasma P to generate a plasma-treated gas GP.

More particularly, when the discharge gas G3 is supplied to the plasma generator 120 through the gas flow passage 120*a* and power for generating the plasma P is applied to the first electrode 122*a* and the second electrode 122*b* of the plasma generator 120, the plasma P may be generated in the internal space 110*s* of the body 110.

The process gas G1 supplied through the process gas inlet 110*a* and the hydrogen gas G2 supplied through the hydrogen gas inlet 110*b* may be reacted to each other while passing the plasma P in the internal space 110*s* of the body 110. That is, a fluorine atom included in the fluorine-including gas that is included in the process gas G1 may be separated or dissociated by the plasma P, and a hydrogen atom of the hydrogen gas G2 may fix the separated or dissociated fluorine atom. That is, the fluorine atom included in the process gas G1 may be reacted with the hydrogen atom included in the hydrogen gas G2 and be converted to hydrogen fluoride (HF) by the plasma treatment. The plasma-treated gas GP on which the plasma treatment is performed may include a hydrogen fluoride gas as a by-product. The plasma-treated gas GP on which the plasma treatment is performed may further include a material of a powder shape, or so on.

The hydrogen supply system 200 may generate the hydrogen gas G2 and supply the hydrogen gas G2 to the plasma treatment system 100. The hydrogen supply system 200 may supply the hydrogen gas G2 to the plasma treatment system 100 so that a number of hydrogen atoms included in the hydrogen gas G2 is greater than a number of fluorine atoms included in the process gas G1 in the plasma treatment system 100. Thereby, the fluorine-including gas included in the process gas G1 may be effectively decomposed and removed.

For example, a vol % of the fluorine-including gas included in the process gas G1 based on a total 100 vol % of the process gas G1 may be measured or determined, and an amount of the hydrogen gas G2 to be supplied to the plasma treatment system 100 may be calculated or determined by considering a chemical formula of the fluorine-including gas and the hydrogen gas G2. For example, when the fluorine-including gas is $NF_3$ gas, the hydrogen supply system 200 may supply the hydrogen gas G2 to the plasma treatment system 100 so that a volume ratio of the hydrogen gas G2 to the $NF_3$ gas is 1.5 times or more by considering a chemical formula of the hydrogen gas G2 is $H_2$. When the fluorine-including gas includes various materials, an amount of the hydrogen gas G2 to be supplied to the plasma treatment system 100 may be calculated or determined by considering amounts of the various materials, chemical formulas of the various materials, or so on. To calculate or determine the amount of the hydrogen gas G2 to be supplied to the plasma treatment system 100 by considering an amount, a chemical formula, or so on of the fluorine-including gas, a determination portion configured to determine the amount of the hydrogen gas G2 may be included. The determination portion configured to determine the amount of the hydrogen gas G2 may be separately provided from a controller that controls the scrubber 10, or may be a part of the controller that controls the scrubber 10.

In FIG. 1, it is illustrated as an example that a sensor 114 is disposed in the process gas inlet 110*a* through which the process gas G1 inflows and measures a vol % of the fluorine-including gas included in the process gas G1. However, the present disclosure is not limited thereto. The amount of the hydrogen gas G2 to be supplied to the plasma treatment system 100 may be calculated or determined by using a vol % of the fluorine-including gas or a number of the fluorine atoms in the fluorine-including gas that is measured in a semiconductor manufacturing process line.

The hydrogen supply system 200 may have any of various structures or types that are capable of supplying the hydrogen gas G2. In some implementations, the hydrogen supply system 200 may include an electrolysis unit 210. The electrolysis unit 210 may generate the hydrogen gas G2 and an oxygen gas (e.g., $O_2$) from water vapor of a gas state or water of a liquid state using electrolysis, for example, water electrolysis.

The electrolysis unit 210 may include an inlet 210*a*, a first outlet 210*b*, and a second outlet 210*c*. The water vapor or the water may inflow through the inlet 210*a*. The hydrogen gas G2 generated by the electrolysis may be discharged through the first outlet 210*b* that is connected to the plasma treatment system 100. A material other than the hydrogen gas G2, that is, a released material G4 may be released to an outside through the second outlet 210*c*. The first outlet 210*b* may be connected to the hydrogen gas inlet 110*b* of the body 110. The released material G4 that is released through the second outlet 210*c* may include an unreacted water vapor or water, the oxygen gas, or so on.

The electrolysis unit 210 may include a cathode electrode and an anode electrode. The hydrogen gas G2 may be generated at the cathode electrode, and the oxygen gas may be generated at the anode electrode. The electrolysis unit 210 may have any of various structures that allow the hydrogen gas G2 generated at the cathode electrode to flow through the first outlet 210*b* and the oxygen gas generated at the anode electrode to flow through the second outlet 210*c*. The unreacted water vapor or water may be released to the outside through the second outlet 210*c*.

For example, the electrolysis unit 210 may have a type of an alkaline electrolysis cell (AEC), an anion exchange membrane (AEM), a polymer electrolyte membrane or a proton exchange membrane (PEM), a solid oxide electrolysis cell (SOE), or so on. However, the present disclosure is not limited thereto.

The wet treatment system 300 may be communicated or connected to the body 110. For example, at least a partial portion of the wet treatment system 300 may be disposed at one side (e.g., a lower portion) of the body 110.

The wet treatment system 300 may supply a wet treatment material 316 to the plasma-treated gas GP on which the plasma treatment is performed to wet-treat or water-treat (treat using the water) the by-product included in the plasma-treated gas GP. For example, the wet treatment system 300 may collect and/or dissolve a hydrogen fluoride gas, a powder-type material, a water-soluble material, or so on that is included in the plasma processing gas GP.

The wet treatment system 300 may include at least one wet treatment unit 310, and a water tank 320 that is communicated or connected to the wet treatment unit 310.

In some implementations, the wet treatment unit 310 may include a first wet treatment unit 310*a* and a second wet treatment unit 310*b*. The first wet treatment unit 310*a* may be disposed at one side (e.g., a lower portion) of the plasma treatment system 100. The second wet treatment unit 310*b* may be disposed at a portion that is different from the plasma treatment system 100 and be communicated or connected to the first wet treatment unit 310*a* through the water tank 320.

The first wet treatment unit 310*a* may act as a wet treatment portion configured to wet-treat the by-product and a cooling portion configured to cool the plasma-treated gas GP. The first wet treatment unit 310*a* may cool the plasma-treated gas GP and prevent undesirable resynthesis of the decomposed or dissociated material that is decomposed or dissociated in the plasma treatment system 100. The second wet treatment unit 310*b* may act as a post-treatment portion configured to additionally remove the by-product from a first wet-treated gas on which the wet treatment is performed in the first wet treatment unit 310*a*.

In FIG. 1, it is illustrated as an example that one first wet treatment unit 310*a* is disposed at the lower portion of the plasma treatment system 100 and the second wet treatment unit 310*b* has a plurality of second wet treatment units 310*b* that are stacked in a vertical direction to have a tower shape. However, the present disclosure is not limited thereto. A position, an arrangement, a number, or so on of the first wet treatment unit 310*a* or the second wet treatment unit 310*b* may be variously modified. At least one of the first wet treatment unit 310*a* and the second wet treatment unit 310*b* may be omitted.

In some implementations, each wet treatment unit 310 may include a wet treatment chamber 312, a spray nozzle 314, and a filler 318 that is disposed below the spray nozzle 314 in an internal space of the wet treatment chamber 312.

The wet treatment chamber 312 may include an internal space where the spray nozzle 314, the filler 318, or so on is disposed and the wet treatment is performed. The spray nozzle 314 may spray the wet treatment material 316. The filler 318 may delay a flow of the wet treatment material 316 that is sprayed from the spray nozzle 314 to increase a contact area between the plasma-treated gas GP and the wet treatment material 316. The filler 318 may include or be formed of any of various materials (e.g., a resin, or so on).

In some implementations, the wet treatment material 316 that is supplied to the wet treatment unit 310 may include water or a base material. When a concentration of the hydrogen fluoride gas included in the plasma-treated gas GP is low, the wet treatment material 316 may be the water. When a concentration of the hydrogen fluoride gas included in the plasma-treated gas GP is a predetermined level or higher, the wet treatment material 316 may be the base material (e.g., sodium hydroxide (NaOH) solution, or so on) that is capable of neutralizing acidity of the hydrogen fluoride gas. In some implementations, a material that is stored in the water tank 320 may be resupplied and reused as the wet treatment material 316.

The wet treatment material 316 may include water that is supplied from the water supply system 500. However, the present disclosure is not limited thereto. The scrubber 10 may include a supply portion of a wet treatment material or a supply portion of a base material, which is separately provided from the water supply system 500. In this instance, the wet treatment material 316 may be supplied from the supply portion of the wet treatment material or the supply portion of the base material.

The water tank 320 may be disposed at a lower portion of the first wet treatment unit 310*a* and/or the second wet treatment unit 310*b*, and may be connected to the first wet treatment unit 310*a* and/or the second wet treatment unit 310*b*. The water tank 320 may accommodate the wet treatment material 316 in which the by-product (e.g., the hydrogen fluoride gas, the powder-type material, or the water-soluble material) included in the plasma processing gas (GP) is dissolved. The material that is accommodated in the water tank 320 may be released to the outside or a wastewater-treatment facility through a drain 322 or may be resupplied to the first wet treatment unit 310*a* and/or the second wet treatment unit 310*b*.

The plasma-treated gas GP may be cooled and be wet-treated by the wet treatment material 316 in the first wet treatment unit 310*a*. Thereby, at least a part of the by-product included in the plasma-treated gas GP may be removed. The first wet-treated gas on which the wet treatment in the first wet treatment unit 310*a* is performed may pass through the water tank 320 and be wet-treated by the wet treatment material 316 in the second wet treatment unit 310*b*. Thereby, the by-product included in the first wet-treated gas on which the wet treatment in the first wet treatment unit 310 is performed may be additionally removed. The wet treatment material 316 in which the by-product is dissolved by the wet treatment in the first wet treatment unit 310*a* and/or the second wet treatment unit 310*b* may be accommodated in the water tank 320 and an exhaust gas GD may rise to an upper portion and be exhausted or released to the outside through a scrubber outlet 330.

The power supply system 400 may provide power (e.g., electrical power) for an operation of the scrubber 10. For example, the power supply system 400 may supply power for an operation of the plasma treatment system 100 and/or the wet treatment system 300. In FIG. 1, it is illustrated as an example that the power supply system 400 is electrically connected to the plasma generator 120 (more particularly, the first electrode 122*a* and the second electrode 122*b*) that is included in the plasma treatment system 100 and applies power for generating the plasma P to the plasma generator 120. Further, the power supply system 400 may apply power for an operation of the spray nozzle 314 of the wet treatment system 300, or so on. In the power supply system 400, a portion that supplies the power for the operation of the plasma treatment system 100 and a portion that supplies the power for the operation of the wet treatment system 300 may be separately provided or be integrated to each other.

The water supply system 500 may include a first water supply line 510 that is connected to the wet treatment system 300 and a first valve 512 configured to control a water flow through the first water supply line 510. In a case that water is used as the wet treatment material 316, the water that is supplied through the first water supply line 510 may be used as the wet treatment material 316 as is. In a case that a base material is used as the wet treatment material 316, a base material that is supplied from a supply portion of a base material may be mixed to water that is supplied through the first water supply line 510 and the mixed material may be used as the wet treatment material 316. In some implementations, the water supply system 500 might not include the first water supply line 510 and the first valve 512, and a supply portion of a wet treatment material or a supply portion of a base material that separately supplies the wet treatment material 316, such as the water or the base material, may be further included.

In some implementations, the power supply system 400 or an electrical line that supplies power to the plasma treatment system 100 and/or the wet treatment system 300 may supply power to the hydrogen supply system 200 or the electrolysis unit 210. The water supply system 500 or a water line that supplies water to the wet treatment system 300 may be configured to supply water vapor or water to the hydrogen supply system 200 or the electrolysis unit 210.

For example, the power supply system 400 that supplies the power to the plasma treatment system 100 and/or the wet treatment system 300 may be electrically connected to the hydrogen supply system 200 or the electrolysis unit 210 to supply the power to the hydrogen supply system 200 or the electrolysis unit 210. For example, the water supply system 500 may include a second water supply line 520 that is connected to the hydrogen supply system 200 or the electrolysis unit 210, and a second valve 522 configured to control a water flow through the second water supply line 520. When water is supplied to the electrolysis unit 210, the water that is supplied through the second water supply line 520 may be supplied to the electrolysis unit 210. When water vapor is supplied to the electrolysis unit 210, a heat source or a vapor-water supplier may be further included. The heat source may convert the water supplied through the second water supply line 520 into the water vapor before the electrolysis unit 210. The vapor-water supplier may be separately provided from the water supply system 500 to supply the water vapor to the electrolysis unit 210.

Thereby, an additional power supply system or an additional water supply system for an operation of the hydrogen supply system 200 or the electrolysis unit 210 may be omitted. Accordingly, the scrubber 10 may be easily implemented by adding the hydrogen supply system 200 or the electrolysis unit 210. That is, there may be no burden on new facilities and restrictions when implementing facilities may be minimized. However, the present disclosure is not limited thereto. An additional power supply system, an additional water supply system, and/or an additional water-vapor supply system for the operation of the hydrogen supply system 200 or the electrolysis unit 210 may be further provided.

In FIG. 1 and the above, the power supply system 400 and the water supply system 500 are schematically illustrated and described. A structure, a type, a kind, or so on of the power supply system 400 or the water supply system 500 may be variously modified.

In some implementations, the hydrogen supply system 200 may include the electrolysis unit 210, and thus, the hydrogen supply system 200 may stably generate the hydrogen gas G2 and may have a small size and a simple structure.

An amount of the fluorine-including gas included in the process gas G1 may be small (e.g., 1 vol % or less), and an amount of the hydrogen gas G2 to be supplied to the plasma treatment system 100 may be small. For example, based on a total 100 vol % of the process gas G1, the hydrogen gas G2 may be supplied by 5 vol % or less (e.g., 2 vol % or less). For example, when the process gas G1 that is supplied to the plasma treatment system 100 is 100 liters per minute (LPM), an amount of the hydrogen gas G2 for treating the fluorine-including gas included in the process gas G1 may be 5 LPM or less (e.g., 2 LPM or less). In some implementations, the hydrogen gas G2 may be used as an auxiliary gas for fixing the fluorine atom, and the hydrogen gas G2 may be supplied in a very small amount and a concentration of the hydrogen gas G2 in the plasma treatment portion 100 may be low. Accordingly, it may be stable.

As in the above, the amount of the hydrogen gas G2 to be generated by the electrolysis unit 210 is small, and thus, the hydrogen gas G2 for treating the fluorine-including gas included in the process gas G1 may be sufficiently generated by the electrolysis unit 210 using a small amount of water vapor or water and a small amount of power. For example, a length of a long side of the electrolysis unit 210 may be 50 cm or less (e.g., 30 cm or less), and power for an operation of the electrolysis unit 210 may be 100 W or less (e.g., 20 W or less). The amount of the water vapor or the water for the electrolysis unit 210 may be very small compared to the amount of the water for the wet treatment system 300, and the power for the electrolysis unit 210 may be very small compared to the power (e.g. 1 kW or more, more particularly, 1 kW to 10 kW) for the scrubber 10. Accordingly, a small amount of water may be allocated from the water supply system 500 and/or a small amount of power may be allocated from the power supply system 400, and the electrolysis unit 210 may be operated by using the allocated small amount of water and/or the allocated small amount of power.

That is, the electrolysis unit 210 that may have the small size and be operated by the small amount of water and the small amount of power may be used as the hydrogen supply system 200 that supplies the hydrogen gas G2. Accordingly, the electrolysis unit 210 or the hydrogen supply system 200 may be easily applied to scrubbers 10 having various structure at low cost, and an additional equipment, apparatus, or so on does not need.

In the above descriptions, the hydrogen supply system 200 may include the electrolysis unit 210. In some implementations, the hydrogen supply system 200 might not include the electrolysis unit 210 and may have any of various structures, types, or so on that are capable of generating the hydrogen gas G2.

Figure 3:
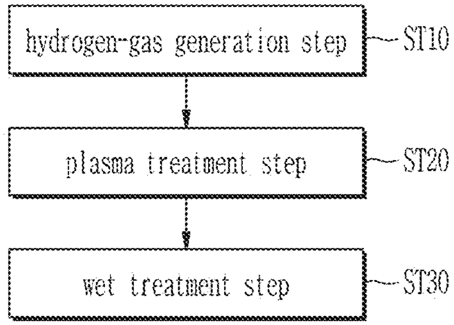
FIG. 3 is a flowchart that illustrates an example of a treatment method of a semiconductor process gas according to some implementations.

FIG. 3 is a flowchart that illustrates an example of a treatment method of a semiconductor process gas (e.g. a process gas G1) according to some implementations. Referring to FIG. 3 together with FIGS. 1 and 2, an operation of a scrubber 10 and a treatment method or a purification method of a semiconductor process gas using the scrubber 10 will be described. The semiconductor process gas may be a process gas G1 that is or includes any of various gases, such as, a raw process gas of a semiconductor manufacturing process, a gas that is generated in the semiconductor manufacturing process, or so on.

In FIG. 3, a treatment method of a semiconductor process gas may include a hydrogen-gas generation step ST10, a plasma treatment step ST20, and a wet treatment step ST30.

In the hydrogen-gas generation step ST10, an electrolysis unit 210 may electrolyze water vapor or water and generate a hydrogen gas G2, and the hydrogen gas G2 may be supplied to a plasma treatment system 100. More particularly, the electrolysis unit 210 may electrolyze water vapor or water that is supplied through a first water supply line 520 and generate the hydrogen gas G2, an oxygen gas, or so on. A reaction formula of the electrolysis of the water vapor or the water that is performed in the electrolysis unit 210 may be as follows:

$$2H_2O \rightarrow 2H_2 + O_2 \qquad \text{[Reaction Formula 1]}$$

The hydrogen gas G2 that is generated by the electrolysis unit 210 may be discharged through a first outlet **210*b* that is connected to a plasma treatment system 100 (more particularly, a hydrogen gas inlet 110*b*) and be supplied to the plasma treatment system 100. A released material G4, which is a material other than the hydrogen gas G2, such as the oxygen gas or the unreacted water vapor or water, or so on may be released through a second outlet 210*c*** without being used.

In the above, it is described as an example that a hydrogen supply system 200 generates the hydrogen gas G2 using the electrolysis unit 210. However, the present disclosure is not limited thereto. The hydrogen supply system 200 may generate the hydrogen gas G2 using any of various types, structures, or so on, and/or the electrolysis unit 210 may be omitted.

In the plasma treatment step ST20, a plasma treatment in which a process gas G1 and the hydrogen gas G2 are reacted using plasma P may be performed.

More particularly, when a discharge gas G3 is supplied through a gas flow passage **120*a* and power configured to generate the plasma P is applied to a plasma generator 120 (more particularly, a first electrode 122*a* and a second electrode 122*b*), the discharge gas G3 may be ionized to generate the plasma P. The plasma P may have high thermal energy due to an interaction between electrons and ions, and may thermally decompose and/or radically decompose the process gas G1**.

When the hydrogen gas G2 is supplied to the plasma treatment system 100 through the hydrogen gas inlet **110*b* and the process gas G1 is supplied to the plasma treatment system 100 through a process gas inlet 110*a*, the process gas G1 may be decomposed by the plasma treatment using the plasma P. For example, a fluorine atom that is generated by a thermal and/or radical decomposition of a fluorine-including gas included in the process gas G1 may be reacted with a hydrogen atom and be converted to a hydrogen fluoride gas. In a case that the fluorine-including gas included in the process gas G1** is $NF_3$, a reaction formula by the plasma treatment may be as follows:

$$2NF_3+3H_2 \Rightarrow N_2+6HF \quad \text{[Reaction formula 2]}$$

In some implementations, unlike a combustion method, the fluorine atom included in the fluorine-including gas may be fixed to the hydrogen atom and be converted to the hydrogen fluoride using the plasma treatment, which is an oxygen-free reaction that does not use oxygen (e.g., the plasma treatment using the hydrogen gas G2). Thereby, a reaction that converts the fluorine atom to the hydrogen fluoride may be efficiently performed and the process gas G1 may be efficiently purified. When the fluorine-including gas included in the process gas G1 is a material other than $NF_3$, the fluorine-including gas may be plasma-treated so that a fluorine atom included in the fluorine-including gas is converted to the hydrogen fluoride. In some implementations, another gas (more particularly, an oxygen-free gas that does not include oxygen) may be further supplied for a reaction with an atom that is other than the fluorine atom and is included in the fluorine-including gas.

In the wet treatment step ST30, a by-product generated by the plasma treatment step ST20 may be wet-treated. A plasma-treated gas GP on which the plasma treatment step ST20 is performed may move through a wet treatment unit 310 and the by-product (e.g., the hydrogen fluoride gas, or so on) included in the plasma-treated gas GP may be dissolved in a wet treatment material 316 supplied from a spray nozzle 314. The wet treatment material 316 in which the by-product is dissolved may be accommodated in a water tank 320 and an exhaust gas GD may rise to an upper portion and be exhausted or released to an outside through a scrubber outlet 330.

In some implementations, by the plasma treatment system 100 and the wet treatment system 300, the process gas G1 may be treated to have a concentration of the fluorine-including gas (e.g., a perfluorinated compound) below a standard level and then may be released.

The process gas G1, the hydrogen gas G2, and the discharge gas G3 that are involved in the plasma treatment do not include oxygen and fuel (e.g., a carbon-including material that includes carbon), and the exhaust gas GD might not include an oxygen-including gas (e.g., carbon dioxide, nitrogen oxide, or so on). That is, the process gas G1 may be treated while minimizing generation of harmful materials, such as, carbon dioxide, nitrogen oxide, or so on.

In some implementations, an amount of the oxygen-including gas included in the exhaust gas GD may be very small and be less than an amount of the oxygen-free gas included in the exhaust gas GD. For example, in a case that the fluorine-including gas included in the process gas G1 is $NF_3$, most of the exhaust gas GD may be a nitrogen gas. In some implementations, the exhaust gas GD may be a nitrogen-oxide-free gas with a very low amount of nitrogen oxide (e.g., $N_2$). The nitrogen-oxide-free gas may refer to a gas that does not include the nitrogen oxide and a gas that includes the nitrogen oxide with a low concentration, which is lower than an allowable exhaust standard of harmful materials. For example, a concentration of the nitrogen oxide in the exhaust gas GD may be 10 ppm or less. Thus, an amount of the harmful materials included in the exhaust gas GD may be reduced, and an exhaust load may be reduced.

According to some implementations, by the hydrogen supply system 200 that supplies the hydrogen gas G2 to the plasma treatment system 100, efficiency of the plasma treatment that decomposes the process gas G1 may be enhanced by using the plasma P and the hydrogen gas G2, and the amount of the harmful materials included in the exhaust gas GD may be reduced and the exhaust load may be reduced. The hydrogen supply system 200 may include the electrolysis unit 210 that may have the small size and be operated by the small amount of water and the small amount of power, and the scrubber 10 may have a simple structure or equipment.

On the other hand, in a scrubber according to a comparative example that includes a burner (a combustion treatment portion) instead of a plasma treatment system, fuel and a combustion gas are supplied to combust a process gas. Accordingly, an exhaust gas may include a large amount of carbon dioxide, nitrogen oxide, or so on, and an exhaust capacity may be large. If the combustion is performed under a rich-burn condition to reduce generation of the nitrogen oxide, unreacted fuel, which is a greenhouse gas, may be released to an outside. If the combustion is performed under a lean-burn condition to reduce the generation of the nitrogen oxide, treatment efficiency of the process gas may be reduced due to a lack of a combustion amount, and carbon oxide may be generated due to incomplete combustion. In a case that a material of fuel is changed to reduce the generation of the carbon oxide or so on, other problems may occur. For example, when hydrogen gas ($H_2$) may be used as the fuel, there may be a high risk of leakage and an explosion accident. When ammonia ($NH_3$) is used as the fuel, problems such as a safety accident, a bad smell, or so on may occur. Further, equipment may be complicated because the scrubber is equipped with the burner for combustion and a supply line for supplying the combustion gas.

In another comparative example in which a plasma treatment is performed using a hydrogen atom included in water vapor or water supplied to or existing in a plasma treatment system, an oxygen atom is included in the water vapor or water, and an exhaust gas may include nitrogen oxide or so on, and an exhaust capacity may be large. Further, a fluorine atom is reacted with the hydrogen atom included in the water vapor or water, conversion efficiency to a hydrogen fluoride gas may be lower than conversion efficiency of an embodiment in which a fluorine atom is reacted with a hydrogen atom included in a hydrogen gas.

Hereinafter, referring to FIGS. 4 to 9, examples of scrubbers and treatment methods of semiconductor process gases using them will be described in detail. To the extent that an element is not described in detail below, it may be understood that the element is at least substantially similar (and/or the same as) to a corresponding element that has been described elsewhere within the present disclosure. A portion which is not described in the above will be described in detail.

Figure 4:
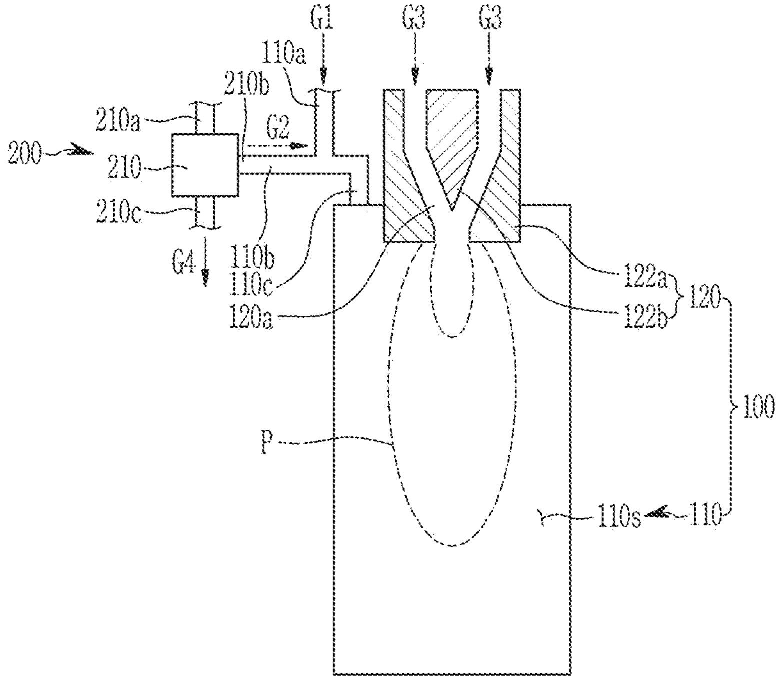
FIG. 4 schematically illustrates an examples of a plasma treatment portion and a hydrogen supply portion that are included in a scrubber according to some implementations.

FIG. 4 schematically illustrates examples of a plasma treatment system 100 and a hydrogen supply system 200 that are included in a scrubber. FIG. 4 illustrates a portion that corresponds to FIG. 2. Hereinafter, the plasma treatment portion 100 and the hydrogen supply portion 200 will be mainly described.

In FIG. 4, in a plasma treatment system 100, a process gas inlet 110_a_ through which a process gas G1 inflows and a hydrogen gas inlet 110_b_ through which a hydrogen gas G2 inflows may be connected together to a common inlet 110_c_ that is connected to a body 110. In this instance, the hydrogen gas inlet 110_b_ may correspond to or be connected to a first outlet 210*b* of a hydrogen supply system 200 or an electrolysis unit 210 through which a hydrogen gas G2 is discharged. The process gas inlet 110*a* or the hydrogen gas inlet 110*b* may be connected to an internal space 110*s* of the body 110 through the common inlet 110*c*.

In some implementations, by including the common inlet 110*c* that supplies the process gas G1 and the hydrogen gas G2 to the internal space 110*s* of the body 110, a structure of the plasma treatment system 100 may be simplified.

Figure 5:
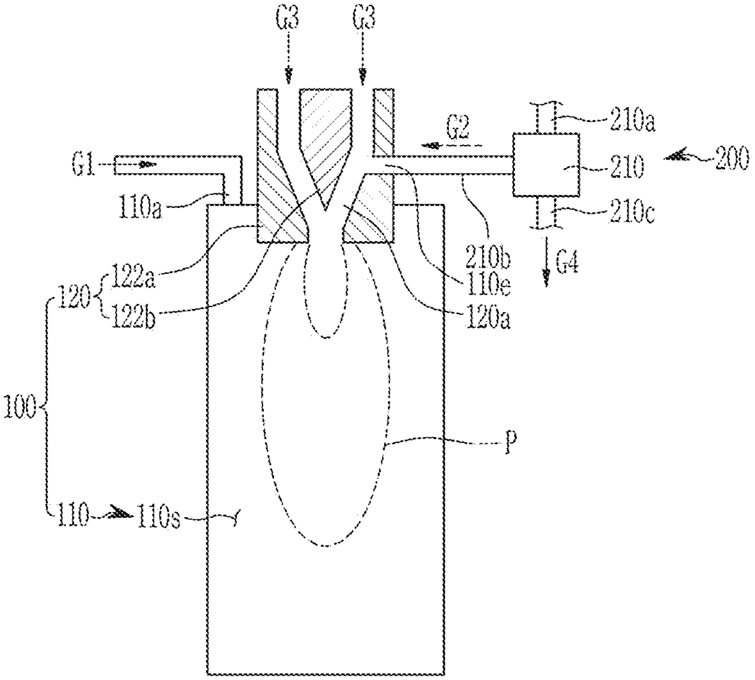
FIG. 5 schematically illustrates examples of a plasma treatment portion and a hydrogen supply portion that are included in a scrubber according to some implementations.

FIG. 5 schematically illustrates examples of a plasma treatment portion 100 and a hydrogen supply portion 200 that are included in a scrubber according to some implementations. FIG. 5 illustrates a portion that corresponds to FIG. 2. Hereinafter, the plasma treatment portion 100 and the hydrogen supply portion 200 will be mainly described.

In FIG. 5, in a plasma treatment system 100, a process gas inlet 110*a* through which a process gas G1 inflows may be connected to a body 110, and a hydrogen gas inlet 110*e* through which a hydrogen gas G2 is supplied may be connected to a gas flow passage 120*a* of a plasma generator 120. More particularly, a first outlet 210*b* of an electrolysis unit 210 through which the hydrogen gas G2 is discharged may correspond to or be connected to the hydrogen gas inlet 110*e*.

The hydrogen gas G2 may be supplied through the gas flow passage 120*a* of the plasma generator 120, and thus, the hydrogen gas G2 may directly involve generation of the plasma P, together with a discharge gas G3 configured to generate a plasma P. As a result, the plasma P may be efficiently generated.

In FIG. 5, it is illustrated as an example that the hydrogen gas inlet 110*e* through which the hydrogen gas G2 is supplied is separately provided from an inlet of the plasma generator 120 or the gas flow passage 120*a* through which the discharge gas G3 is supplied. That is, the hydrogen gas inlet 110*e* may be a passage that is branched from the gas flow passage 120*a* through which the discharge gas G3 is supplied, and supplies of the discharge gas G3 and the hydrogen gas G2 may be easily and stably controlled and stability may be enhanced. However, the present disclosure is not limited thereto. In some implementations, the hydrogen gas G2 that is mixed with the discharge gas G3 may be supplied to the inlet of the plasma generator 120 or the gas flow passage 120*a*.

Figure 6:
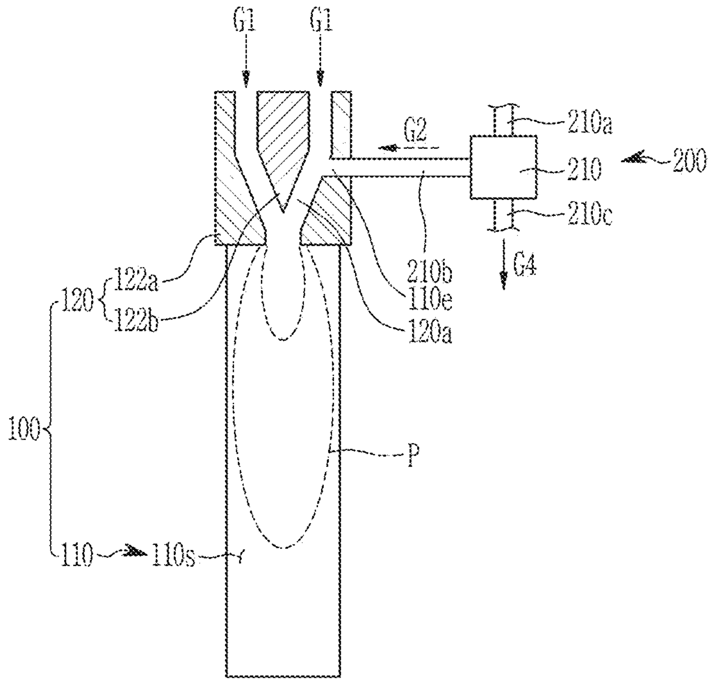
FIG. 6 schematically illustrates examples of a plasma treatment portion and a hydrogen supply portion that are included in a scrubber according to some implementations.

FIG. 6 schematically illustrates examples of a plasma treatment portion 100 and a hydrogen supply portion 200 that are included in a scrubber according to some implementations. FIG. 6 illustrates a portion that corresponds to FIG. 2. Hereinafter, the plasma treatment portion 100 and the hydrogen supply portion 200 will be mainly described.

In FIG. 6, in a plasma treatment system 100, a process gas G1 may be supplied through an inlet of a plasma generator 120 or a gas flow passage 120*a*, and a hydrogen gas inlet 110*e* through with a hydrogen gas G2 is supplied may be connected to the gas flow passage 120*a* of the plasma generator 120. More particularly, a first outlet 210*b* of an electrolysis unit 210 through which the hydrogen gas G2 is discharged may correspond to or be connected to the hydrogen gas inlet 110*e*.

Since the process gas G1 includes a nitrogen gas ($N_2$), the process gas G1 may act as a discharge gas configured to generate plasma P. Accordingly, in some implementations, the process gas G1 may be used as a discharge gas. That is, the process gas G1 may be treated by a direct plasma treatment in which the plasma P is generated using the process gas G1. Thereby, efficiency of the plasma treatment may be enhanced. A discharge gas G3 (refer to FIG. 5) that is additionally supplied may be omitted, and an amount of an exhaust gas may be reduced by an amount corresponding to the discharge gas G3.

In FIG. 6, it is illustrated as an example that a body 110 has an area (e.g. a planar area) less than an area (e.g. a planar area) of the plasma generator 120. The area of the body 110 may be reduced by omitting a process gas inlet 110*a* (refer to FIG. 2) and a hydrogen gas inlet 110*b* (refer to FIG. 2) that are connected to the body 110. However, the present disclosure is not limited thereto, and the body 110 may have an area the same as or greater than an area of the plasma generator 120.

Figure 7:
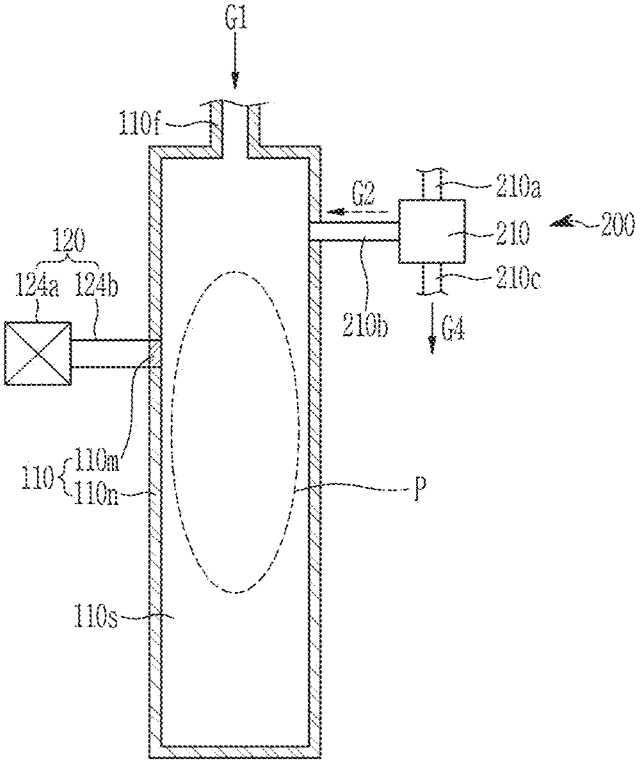
FIG. 7 schematically illustrates examples of a plasma treatment portion and a hydrogen supply portion that are included in a scrubber according to some implementations.

FIG. 7 schematically illustrates examples of a plasma treatment system 100 and a hydrogen supply system 200 that are included in a scrubber according to some implementations. FIG. 7 illustrates a portion that corresponds to FIG. 2. Hereinafter, the plasma treatment portion 100 and the hydrogen supply portion 200 will be mainly described.

In FIG. 7, plasma P that is generated by a plasma generator 120 may be microwave plasma that is generated using microwave. That is, the plasma generator 120 may ionize a process gas G1 and/or a discharge gas using microwave to generate microwave plasma.

In some implementations, the plasma generator 120 may include a microwave generator 124*a* and a waveguide 124*b*. The microwave generator 124*a* may be disposed outside a body 110 and generate microwave to generate the plasma P. The waveguide 124*b* may transmit the microwave that is generated by the microwave generator 124*a* to the body 110. In some implementations, the microwave generator 124*a* may be a magnetron. The waveguide 124*b* may have any of various structures, methods, types, or so on that are capable of transmitting the microwave. In some implementations, the microwave is mixed into the plasma P, and the process gas G1 may be effectively decomposed even with low power.

In FIG. 7, it is illustrated as an example that the waveguide 124*b* may be perpendicular to an extension direction of the body 110. However, the present disclosure is not limited thereto, and a shape, a position, an arrangement, or so on of the waveguide 124*b* may be variously modified.

In some implementations, at least a partial portion of the body 110 (e.g., a first portion 110*m* through which the microwave passes) may include an insulating material to allow the microwave to pass through. For example, an entire portion of the body 110 may include a non-metal or insulating material. In some implementations, the body 110 may include the first portion 110*m* that includes the non-metal or insulating material and a second portion 110*n* that includes a metal material. For example, the non-metal or insulating material included in the body 110 or the first portion 110*m* may include or be formed of alumina, quartz, or so on, and the metal material included in the body 110 or the second portion 110*n* may include a corrosion-resistant material such as stainless steel, a corrosion-resistant nickel alloy, or so on. However, the present disclosure is not limited thereto and the body 110 may include any of various materials.

In some implementations, a plasma treatment portion 100 may include a body inlet 110*f* that is connected to the body 110, and a process gas G1 may be supplied through the body inlet 110*f*. In some implementations, the process gas G1 may be used as a discharge gas. The process gas G1 may be treated by a direct plasma treatment in which the plasma P is generated using the process gas G1. Thereby, efficiency of the plasma treatment may be enhanced. A discharge gas G3 (refer to FIG. 5) that is additionally supplied may be omitted, and an amount of an exhaust gas may be reduced by an amount corresponding to the discharge gas G3. In some implementations, the body inlet 110*f* may correspond to a process gas inlet and/or a discharge gas inlet.

However, the present disclosure is not limited thereto. In some implementations, the discharge gas G3 may be supplied through the body inlet 110*f*, and a process gas inlet that is connected to the body 110 may be separately included from the body inlet 110*f*.

A hydrogen gas G2 may directly involve generation of the plasma P, together with the discharge gas configured to generate the plasma P. As a result, the plasma P may be efficiently generated.

In FIG. 7, it is illustrated as an example that a first outlet 210*b* of an electrolysis unit 210 is connected to an internal space 110*s* of the body 110 and is separated from the body inlet 110*f* through which the process gas G1 inflows. In this instance, the first outlet 210*b* of the electrolysis unit 210 through which the hydrogen gas G2 is discharged may correspond to or be connected to a hydrogen gas inlet.

However, the present disclosure is not limited thereto. In some implementations, the first outlet 210*b* of the electrolysis unit 210 may be connected to the body inlet 110*f*. In this instance, the process gas G1 and the hydrogen gas G2 may be mixed and then be supplied to the internal space 110*s* of the body 110 through the body inlet 110*f*. In some implementations, the first outlet 210*b* of the electrolysis unit 210 may be connected to a passage that is branched from the body inlet 110*f*. Other various modifications are possible.

Figure 8:
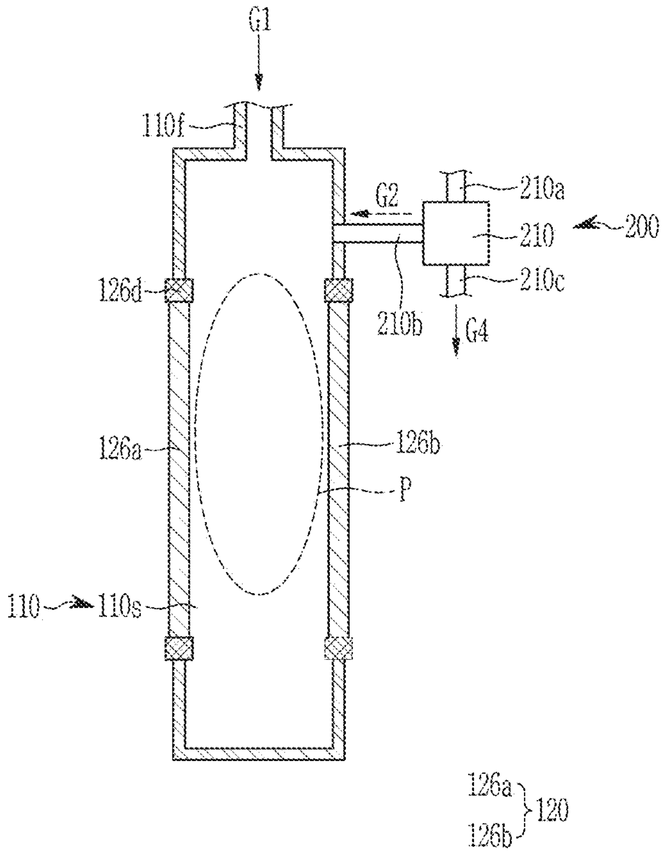
FIG. 8 schematically illustrates examples of a plasma treatment portion and a hydrogen supply portion that are included in a scrubber according to some implementations.

FIG. 8 schematically illustrates examples of a plasma treatment portion 100 and a hydrogen supply portion 200 that are included in a scrubber according to some implementations. FIG. 8 illustrates a portion that corresponds to FIG. 2. Hereinafter, the plasma treatment portion 100 and the hydrogen supply portion 200 will be mainly described.

In FIG. 8, plasma P that is generated by a plasma generator 120 may be capacitively coupled plasma.

In some implementations, the plasma generator 120 may include a first electrode 126*a* and a second electrode 126*b* configured to generate the capacitively coupled plasma. The first electrode 126*a* and the second electrode 126*b* may be spaced apart from each other and face each other. The first electrode 126*a* and the second electrode 126*b* may be disposed in a portion where a partial portion of a body 110 is removed, or be disposed inside the body 110. For example, the body 110 may have a cylindrical shape, and the first electrode 126*a* and/or the second electrode 126*b* may have a plan shape of an arc shape. However, the present disclosure is not limited thereto, and a shape of the body 110, the first electrode 126*a*, and/or the second electrode 126*b* may be variously modified. The first electrode 126*a* and the second electrode 126*b* may be disposed in an internal space 110*s* of the body 110, or may be disposed outside the body 110.

When high frequency power may be applied to the first electrode 126*a* and the second electrode 126*b*, the capacitively coupled plasma may be generated. By the capacitively coupled plasma, a condition for generating the plasma P may be easily controlled, and efficiency of generating the plasma P may be enhanced.

The body 110 may include a non-metal or insulating material and/or a metal material. For example, an entire portion of the body 110 may include a non-metal or insulating material, the entire portion of the body 110 may include a metal material, or the body 110 may include a first portion that includes the non-metal or insulating material and a second portion that includes the metal material. However, the present disclosure is not limited thereto, and the body 110 may include any of various materials. In a case that the first electrode 126*a* and the second electrode 126*b* may be disposed in the internal space 110*s* of the body 110 or be disposed outside the body 110, the body 110 may include the first portion that includes the non-metal or insulating material to enhance stability.

In a case that the body 110 include the metal material, an insulating member 126*d* may be further included to insulate the first and second electrodes 126*a* and 126*b* that are included in the plasma generator 120 from the body 110. In some implementations, in a case that an entire portion of the body 110 includes or is formed of the insulating material or portions of the body 110 that are adjacent to the first and second electrodes 126*a* and 126*b* that are included in the plasma generator 120 includes or is formed of the insulating material, the insulating member 126*d* may be omitted.

In some implementations, a plasma treatment system 100 may include a body inlet 110*f* that is connected to the body 110, and a process gas G1 may be supplied through the body inlet 110*f*. In some implementations, the process gas G1 may be used as a discharge gas. The process gas G1 may be treated by a direct plasma treatment in which the plasma P is generated using the process gas G1. Thereby, efficiency of the plasma treatment may be enhanced. A discharge gas G3 (refer to FIG. 5) that is additionally supplied may be omitted, and an amount of an exhaust gas may be reduced by an amount corresponding to the discharge gas G3. In some implementations, the body inlet 110*f* may correspond to a process gas inlet and/or a discharge gas inlet.

However, the present disclosure is not limited thereto. In some implementations, the discharge gas G3 may be supplied through the body inlet 110*f*, and a process gas inlet that is connected to the body 110 may be separately included from the body inlet 110*f*.

A hydrogen gas G2 may directly involve generation of the plasma P, together with the discharge gas configured to generate the plasma P. As a result, the plasma P may be efficiently generated.

In FIG. 8, it is illustrated as an example that a first outlet 210*b* of an electrolysis unit 210 is connected to an internal space 110*s* of the body 110 and is separated from the body inlet 110*f* through which the process gas G1 inflows. In this instance, the first outlet 210*b* of the electrolysis unit 210 through which the hydrogen gas G2 is discharged may correspond to or be connected to a hydrogen gas inlet.

However, the present disclosure is not limited thereto. In some implementations, the first outlet 210*b* of the electrolysis unit 210 may be connected to the body inlet 110*f*. In this instance, the process gas G1 and the hydrogen gas G2 may be mixed and then be supplied to the internal space 110*s* of the body 110 through the body inlet 110*f*. In some implementations, the first outlet 210*b* of the electrolysis unit 210 may be connected to a passage that is branched from the body inlet 110*f*. Other various modifications are possible.

Figure 9:
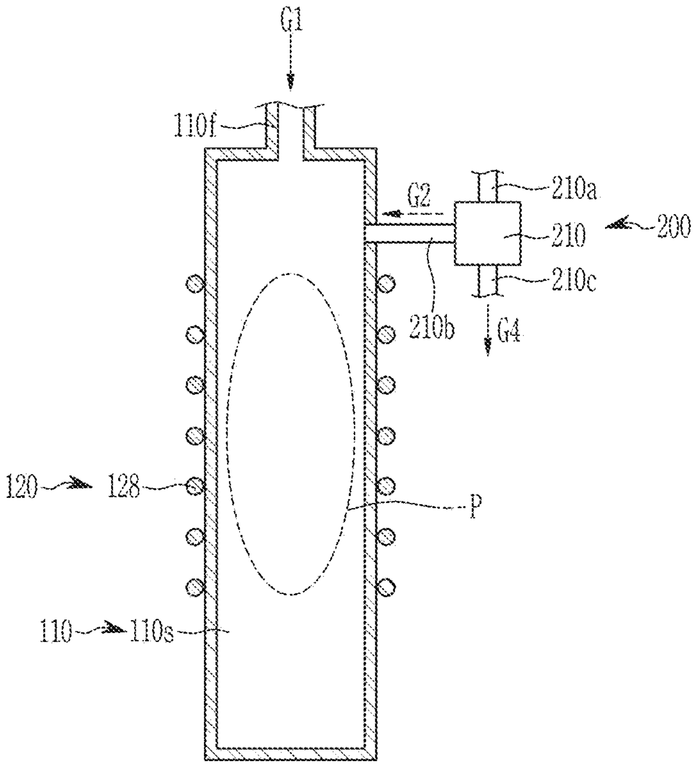
FIG. 9 schematically illustrates examples of a plasma treatment portion and a hydrogen supply portion that are included in a scrubber according to some implementation.

FIG. 9 schematically illustrates examples of a plasma treatment portion 100 and a hydrogen supply portion 200 that are included in a scrubber according to some implementations. FIG. 9 illustrates a portion that corresponds to FIG. 2. Hereinafter, the plasma treatment portion 100 and the hydrogen supply portion 200 will be mainly described.

In FIG. 9, plasma P that is generated by a plasma generator 120 may be inductively coupled plasma.

In some implementations, the plasma generator 120 may include an induction coil 128 configured to generate the inductively coupled plasma. The induction coil 128 may be wound to surround a body 110 outside the body 110. The induction coil 128 may be wound to have a plurality of turns.

For example, the induction coil 128 may be wound in a solenoid shape, a cylindrical shape, or a spiral shape with a concentric axis, but the present disclosure is not limited thereto. The induction coil 128 may include a metal material, but the present disclosure is not limited thereto.

When high frequency power is applied to the induction coil 128, the inductively coupled plasma may be generated in an internal space 110*s* of the body 110 that is disposed inside the induction coil 128. By the inductively coupled plasma, the plasma P may be stably generated.

In some implementations, the body 110 may include a non-metal or insulating material. For example, an entire portion of the body 110 may include a non-metal or insulating material, or the body 110 may include a first portion that includes the non-metal or insulating material and a second portion that includes a metal material. However, the present disclosure is not limited thereto, and the body 110 may include any of various materials.

In some implementations, a plasma treatment system 100 may include a body inlet 110*f* that is connected to the body 110, and a process gas G1 may be supplied through the body inlet 110*f*. In some implementations, the process gas G1 may be used as a discharge gas. The process gas G1 may be treated by a direct plasma treatment in which the plasma P is generated using the process gas G1. Thereby, efficiency of the plasma treatment may be enhanced. A discharge gas G3 (refer to FIG. 5) that is additionally supplied may be omitted, and an amount of an exhaust gas may be reduced by an amount corresponding to the discharge gas G3. In some implementations, the body inlet 110*f* may correspond to a process gas inlet and/or a discharge gas inlet.

However, the present disclosure is not limited thereto. In some implementations, the discharge gas G3 may be supplied through the body inlet 110*f*, and a process gas inlet that is connected to the body 110 may be separately included from the body inlet 110*f*.

The hydrogen gas G2 may directly involve generation of the plasma P, together with the discharge gas configured to generate the plasma P. As a result, the plasma P may be efficiently generated.

In FIG. 9, it is illustrated as an example that a first outlet 210*b* of an electrolysis unit 210 is connected to the internal space 110*s* of the body 110 and is separated from the body inlet 110*f* through which the process gas G1 inflows. In this instance, the first outlet 210*b* of the electrolysis unit 210 through which the hydrogen gas G2 is discharged may correspond to or be connected to a hydrogen gas inlet.

However, the present disclosure is not limited thereto. In some implementations, the first outlet 210*b* of the electrolysis unit 210 may be connected to the body inlet 110*f*. In this instance, the process gas G1 and the hydrogen gas G2 may be mixed and then be supplied to the internal space 110*s* of the body 110 through the body inlet 110*f*. In some implementations, the first outlet 210*b* of the electrolysis unit 210 may be connected to a passage that is branched from the body inlet 110*f*. Other various modifications are possible.

While this disclosure contains many specific implementation details, these should not be construed as limitations on the scope of what may be claimed. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a combination can in some cases be excised from the combination, and the combination may be directed to a subcombination or variation of a subcombination.

What is claimed is:

1. A scrubber, comprising:

a plasma treatment system configured to perform a plasma treatment in which a process gas and a hydrogen gas are reacted using plasma;

a hydrogen supply system configured to supply the hydrogen gas to the plasma treatment system; and a wet treatment system configured to perform a wet treatment in which a by-product generated by the plasma treatment is wet-treated, wherein the hydrogen supply system includes an electrolysis unit.

2. The scrubber of claim 1, wherein the electrolysis unit comprises:

an inlet through which water vapor or water inflows;

a first outlet through which the hydrogen gas generated by electrolysis is discharged and that is connected to the plasma treatment system; and a second outlet through which a material other than the hydrogen gas is released to an exterior of the scrubber.

3. The scrubber of claim 2, wherein the plasma treatment system includes a body having an internal space and a plasma generator configured to generate the plasma, and wherein the first outlet is connected to the internal space of the body or a hydrogen gas inlet connected to the internal space of the body.

4. The scrubber of claim 2, wherein the plasma treatment system includes a body, and a plasma generator configured to generate the plasma and including a gas flow passage, and wherein the first outlet is connected to the gas flow passage.

5. The scrubber of claim 1, wherein a length of a long side of the electrolysis unit is 50 cm or less.

6. The scrubber of claim 1, wherein operational power of the electrolysis unit is 100 W or less.

7. The scrubber of claim 1, wherein the plasma treatment system includes a body having an internal space, a plasma generator configured to generate the plasma, a process gas inlet through which the process gas inflows, and a hydrogen gas inlet through which the hydrogen gas inflows, and wherein the hydrogen gas inlet and the process gas inlet are connected to different portions of the body, or are connected together to a common inlet connected to the body.

8. The scrubber of claim 1, wherein the plasma treatment system includes a body having an internal space, and a plasma generator configured to generate the plasma and including a gas flow passage, and the process gas is supplied through the gas flow passage.

9. The scrubber of claim 1, wherein the process gas is used as a discharge gas configured to generate the plasma.

10. The scrubber of claim 1, further comprising:

a power supply system configured to supply power to the plasma treatment system, wherein the power supply system supplies power to the hydrogen supply system.

11. The scrubber of claim 1, further comprising:

a water supply system configured to supply water to the wet treatment system, wherein the water supply system supplies water to the hydrogen supply system.

12. The scrubber of claim 1, wherein the process gas includes a fluorine-including gas or a perfluorinated compound, and wherein the hydrogen supply system supplies the hydrogen gas to the plasma treatment system so that a number of hydrogen atoms included in the hydrogen gas is greater than a number of fluorine atoms included in the process gas in the plasma treatment system.

13. The scrubber of claim 1, wherein a concentration of nitrogen oxide in an exhaust gas exhausted from the scrubber is 10 ppm or less.

14. The scrubber of claim 1, wherein the plasma generated in the plasma treatment system is or includes at least one of arc plasma, gliding arc plasma, plasma generated by dielectric barrier discharge, plasma generated by corona discharge, microwave plasma, capacitively coupled plasma, inductively coupled plasma, direct current plasma, alternating current plasma, or radio frequency plasma.

15. The scrubber of claim 1, wherein the wet treatment system includes at least one wet treatment unit including a spray nozzle configured to spray a wet treatment material, and a water tank communicated or connected to the at least one wet treatment unit.

16. A scrubber, comprising:

a plasma treatment system configured to decompose a process gas including a fluorine-including gas using plasma; and a hydrogen supply system configured to supply a hydrogen gas to the plasma treatment system, wherein the hydrogen supply system comprises an electrolysis unit.

17. A treatment method of a semiconductor process gas, comprising:

generating a hydrogen gas, wherein generating the hydrogen gas includes performing electrolysis of water vapor or of water to generate the hydrogen gas;

performing a plasma treatment in which a process gas and the hydrogen gas are reacted using plasma; and performing a wet treatment in which a by-product generated by the plasma treatment is wet-treated.

18. The treatment method of claim 17, wherein a concentration of nitrogen oxide in an exhaust gas exhausted after performing of the wet treatment is 10 ppm or less.

* * * * *